(12) United States Patent
Wandres et al.

(10) Patent No.: US 11,346,863 B2
(45) Date of Patent: May 31, 2022

(54) CURRENT-MEASURING UNIT

(71) Applicant: Eberspächer Controls Landau GmbH & Co. KG, Landau (DE)

(72) Inventors: Steffen Wandres, Kandel (DE); Mark-Arno Weimann, Mackenbach (DE)

(73) Assignee: Eberspächer Controls Landau GmbH & Co. KG, Landau (DE)

( * ) Notice: Subject to any disclaimer, the term of this patent is extended or adjusted under 35 U.S.C. 154(b) by 91 days.

(21) Appl. No.: 16/835,574

(22) Filed: Mar. 31, 2020

(65) Prior Publication Data

US 2020/0319233 A1  Oct. 8, 2020

(30) Foreign Application Priority Data

Apr. 2, 2019 (DE) ...................... 10 2019 108 541.1

(51) Int. Cl.
  *G01R 15/14* (2006.01)
  *G01R 31/385* (2019.01)
  *G01R 19/00* (2006.01)

(52) U.S. Cl.
  CPC ....... *G01R 15/146* (2013.01); *G01R 19/0092* (2013.01); *G01R 31/385* (2019.01)

(58) Field of Classification Search
  CPC ........ G01R 15/146; G01R 31/385–396; G01R 19/0092
  See application file for complete search history.

(56) References Cited

U.S. PATENT DOCUMENTS

| 5,831,425 A | * | 11/1998 | Ochiai | G01R 19/0092 324/117 R |
| 8,154,298 B2 | | 4/2012 | Schimmel | |
| 8,947,097 B2 | | 2/2015 | Muller | |
| 2005/0057865 A1 | * | 3/2005 | Veloo | B60R 16/023 361/56 |
| 2008/0030208 A1 | * | 2/2008 | Aratani | G01R 1/203 324/713 |

(Continued)

FOREIGN PATENT DOCUMENTS

| DE | 102004040575 A1 | 2/2006 |
| DE | 102006019895 A1 | 11/2007 |

(Continued)

*Primary Examiner* — Patrick Assouad
*Assistant Examiner* — Demetrius R Pretlow
(74) *Attorney, Agent, or Firm* — McGlew and Tuttle, P.C.

(57) ABSTRACT

A current-measuring unit, especially for measuring a battery current in a vehicle, includes a printed circuit board (12) and a first bus bar (16) leading to and fixed at the printed circuit board that provides at least one first shunt contact surface (30). A second bus bar (18) leading to and fixed at the printed circuit board provides at least one second shunt contact surface (42). A first measuring strip conductor (44) is associated with the first bus bar at the printed circuit board. A second measuring strip conductor (46) is associated with the second bus bar at the printed circuit board. A shunt resistor (48) has a first contact area (50) connected by soldering to the first bus bar and to the first measuring strip conductor and has a second contact area (52) connected by soldering to the second bus bar and to the second measuring strip conductor.

17 Claims, 1 Drawing Sheet

(56) References Cited

U.S. PATENT DOCUMENTS

| | | | |
|---|---|---|---|
| 2008/0238431 A1* | 10/2008 | Schimmel | G01R 31/382 324/426 |
| 2008/0246462 A1* | 10/2008 | Muller | G01R 15/142 324/105 |
| 2008/0265872 A1* | 10/2008 | Nagashima | G01R 1/203 324/126 |
| 2011/0292617 A1* | 12/2011 | Darroman | H02M 7/003 361/728 |
| 2014/0266269 A1* | 9/2014 | Ausserlechner | G01R 19/00 324/713 |
| 2015/0108965 A1* | 4/2015 | Sato | G01R 31/364 324/120 |
| 2016/0111757 A1 | 4/2016 | Kim et al. | |
| 2017/0003322 A1* | 1/2017 | Nakamura | G01R 15/146 |
| 2018/0113153 A1* | 4/2018 | Jang | G01R 1/203 |
| 2018/0156844 A1 | 6/2018 | Kameko et al. | |
| 2018/0356446 A1* | 12/2018 | Yoon | G01R 15/146 |
| 2019/0227104 A1* | 7/2019 | Nakamura | G01R 15/00 |
| 2020/0051717 A1* | 2/2020 | Nakamura | H01C 13/00 |
| 2020/0292589 A1* | 9/2020 | Kraemer | G01R 1/04 |
| 2020/0300919 A1* | 9/2020 | Song | G01R 15/20 |
| 2021/0003615 A1* | 1/2021 | Sasaki | G01R 19/0092 |
| 2021/0190834 A1* | 6/2021 | Endo | G01R 19/0023 |

FOREIGN PATENT DOCUMENTS

| | | | | |
|---|---|---|---|---|
| DE | 102019203498 B3 * | 7/2020 | | G01R 19/32 |
| EP | 1621892 A1 * | 2/2006 | | G01R 1/203 |
| EP | 1621892 A1 | 2/2006 | | |
| JP | H1197203 A * | 4/1999 | | |
| JP | 2000091499 A * | 3/2000 | | H01L 23/3107 |
| JP | 2000131350 A * | 5/2000 | | |
| JP | 2000131350 A | 5/2000 | | |
| JP | 2002-164634 A | 6/2002 | | |
| JP | 2009063527 A | 3/2009 | | |
| JP | 2014119315 A | 6/2014 | | |
| JP | 2015215167 A | 12/2015 | | |
| JP | 2017028057 A | 2/2017 | | |
| KR | 101393104 B1 * | 5/2014 | | |
| KR | 20170104828 A * | 9/2017 | | |
| KR | 1020180011136 A | 1/2018 | | |
| WO | 2007062943 A1 | 6/2007 | | |
| WO | WO-2016186022 A1 * | 11/2016 | | G01R 1/203 |
| WO | 2018055958 A1 | 3/2018 | | |

* cited by examiner

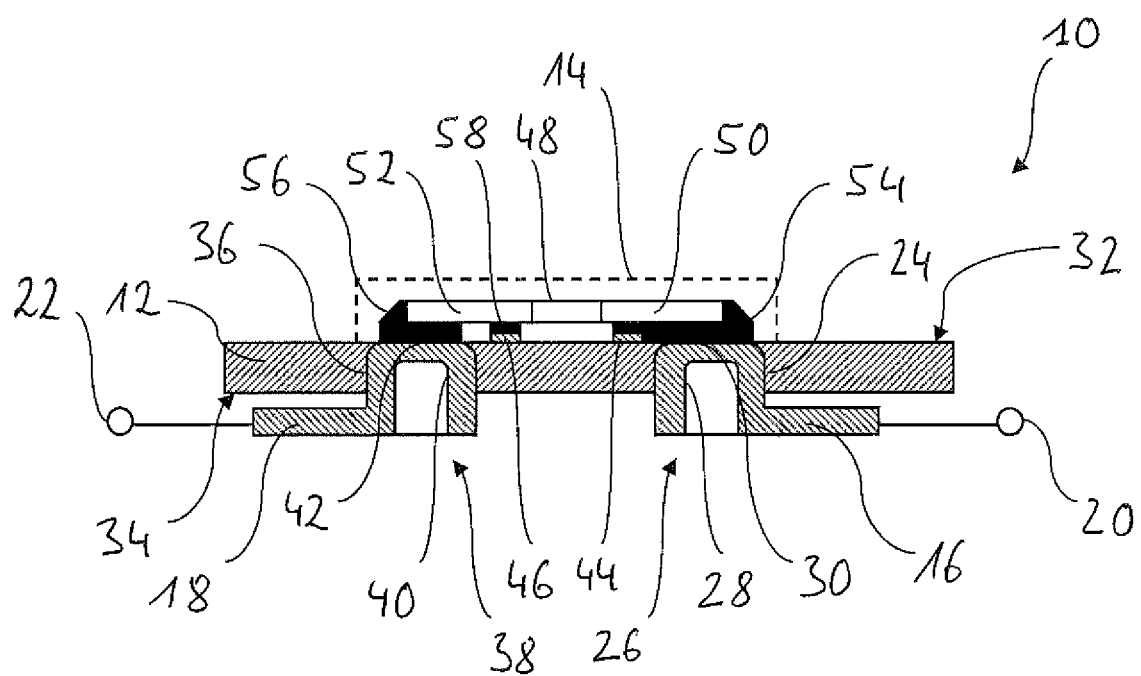

CURRENT-MEASURING UNIT

CROSS REFERENCE TO RELATED APPLICATIONS

This application claims the benefit of priority under 35 U.S.C. § 119 of German Application 10 2019 108 541.1, filed Apr. 2, 2019, the entire contents of which are incorporated herein by reference.

TECHNICAL FIELD

The present invention pertains to a current-measuring unit, which can be used especially to measure the battery current in vehicles, for example, the battery current in vehicles operated by means of electric motors.

TECHNICAL BACKGROUND

Battery management systems, which detect and analyze, among other things, the battery current, are used for a suitable battery management in case of lithium ion batteries, which are used as the energy source in, for example, vehicles operated by means of electric motors. Since the currents may be very high in electric drive systems for vehicles, such battery management systems must be configured for detecting such very high currents.

SUMMARY

An object of the present invention is to provide a current-measuring unit, especially for measuring the battery current in a vehicle, which makes possible a reliable detection of high currents while having a configuration that can be embodied in a simple and cost-effective manner.

This object is accomplished according to the present invention by a current-measuring unit, especially for measuring the battery current in a vehicle, comprising:
- a printed circuit board,
- a first bus bar, which leads to the printed circuit board and is fixed at the printed circuit board, wherein the first bus bar provides at least one first shunt contact surface,
- a second bus bar, which leads to the printed circuit board and is fixed at the printed circuit board, wherein the second bus bar provides at least one second shunt contact surface,
- a first measuring strip conductor associated with the first bus bar at the printed circuit board,
- a second measuring strip conductor associated with the second bus bar at the printed circuit board, and
- a shunt resistor with a first contact area connected by soldering to the first bus bar and to the first measuring strip conductor and with a second contact area connected by soldering to the second bus bar and to the second measuring strip conductor.

Not only is an electrical contacting to the circuit to be monitored established, but it is also made possible to reliably dissipate the power loss generated, in general, in the form of heat via the bus bars in such a shunt resistor by directly connecting such a shunt resistor used in current measurement to the two bus bars leading to the printed circuit board. This makes it possible to use, for example, so-called SMD (Surface-Mounted Device) shunt resistors with a comparatively low power loss, which can then be dissipated efficiently in the form of heat, so that overloading is avoided and the use of resistors configured for higher power losses is not necessary. At the same time, the configuration of the current-measuring unit makes it possible to detect the electrical current being sent over the bus bars by means of a four-conductor measurement.

To establish an electrical connection between the bus bars and the shunt resistor, it is proposed that the printed circuit board have a first measuring passage opening in association with the first bus bar, wherein the first bus bar has a passage/contact area inserted into the first measuring passage opening, and wherein the first passage/contact area of the first bus bar provides the first shunt contact surface positioned in the area of a first side of the printed circuit board and the first bus bar extends on a side of the printed circuit board that faces away from the first side, and that the printed circuit board has a second measuring-passage opening in association with the second bus bar, wherein the second bus bar has a second passage/contact area inserted into the second measuring passage opening, and wherein the second passage/contact area of the second bus bar provides the second shunt contact surface positioned in the area of the first side of the printed circuit board and the second bus bar extends on the second side of the printed circuit board, which said second side faces away from the first side.

A mutual interference with other system areas provided at the printed circuit board can now be avoided by the first shunt contact surface or/and the second shunt-contact surface being essentially flush with a surface of the printed circuit board on the first side.

In a configuration that can be manufactured in a simple manner and is nevertheless stable, the first passage/contact area may comprise a cup-like (cup-shaped) bulge at the first bus bar, or/and the second passage/contact area may comprise a cup-shaped bulge at the second bus bar.

It is further proposed for an efficient dissipation of heat from the area of the printed circuit board that the first bus bar be arranged on the second side of the printed circuit board at a spaced location from the printed circuit board, or/and that the second bus bar be arranged on the second side of the printed circuit board at a spaced location from the printed circuit board.

Stable holding of the bus bars at the printed circuit board can be established in a simple manner by the first passage/contact area being received by press fit in the first measuring passage opening, or/and by the second passage/contact area being received by press fit in the second measuring/passage opening.

For the electrical contacting of both the respective bus bar and the associated measuring strip conductor in at least one contact area of the first contact area and of the second contact area, the soldering may comprise a soldering area covering the associated shunt contact surface essentially completely and establishing a connection to the associated measuring strip conductor. As an alternative, provisions may be made for the soldering to comprise in at least one contact area of the first contact area and of the second contact area a first soldering area covering the associated shunt contact surface essentially completely and a second soldering area, which is separated from the first soldering area and which establishes a connection to the associated measuring strip conductor.

Further, measuring electronic units may be provided in contact with the first measuring strip conductor and with the second measuring strip conductor at the printed circuit board.

The present invention will be described in detail below with reference to the attached FIGURE. The various features of novelty which characterize the invention are pointed out with particularity in the claims annexed to and forming a part of this disclosure. For a better understanding of the invention, its operating advantages and specific objects attained by its uses, reference is made to the accompanying drawing and descriptive matter in which preferred embodiments of the invention are illustrated.

BRIEF DESCRIPTION OF THE DRAWINGS

In the drawings:
FIG. 1 is a sectional view showing a current-measuring unit.

DESCRIPTION OF PREFERRED EMBODIMENTS

Referring to the drawings, a current-measuring unit 10 shown in FIG. 1 comprises a printed circuit board 12. A schematically suggested measuring electronic unit 14, via which the electrical current flowing over two bus bars 16, 18 can be detected and analyzed, is provided at the printed circuit board 12. The measuring electronic unit 14 may comprise, for example, a microprocessor.

When the current-measuring unit 10 is used to measure the battery current of a lithium ion battery, for example, in an electric motor-driven vehicle, for example, the first bus bar 16 may be connected to a connection terminal 20 provided in a vehicle, while the second bus bar 18 may be connected to a schematically suggested positive pole or negative pole 22 of the battery. Integration of the current-measuring unit 10 is, of course, possible in other areas of the current conduction between a battery and a user of electricity, e.g., the drive motor in an electric motor-driven vehicle.

In association with the first bus bar 16, the printed circuit board 12 has a first measuring passage opening 24. A second passage/contact area 26, which is positioned such that it meshes with the printed circuit board at the first measuring passage opening 24 and is fixed in this first measuring passage opening 24 by, for example, press fit, is provided at the first bus bar 16. The first passage/contact area 26 may be provided, for example, by a cup-shaped bulge 28 of the first bus bar, which is made, for example, of copper material. The first passage/contact area provides a first shunt contact surface 30 corresponding essentially to the cross-sectional area of the first measuring passage opening 24. The first passage/contact area 26 is inserted into the first measuring passage opening 24 accommodating this passage/contact area 26 such that the first shunt contact surface 30 is essentially flush with a surface on a first side 32 of the printed circuit board 12. The bus bar 16 is guided with its section adjoining the first passage/contact area 26 at a spaced location from a second side 34 of the printed circuit board 12, which second side 34 faces away from the first side 32.

A second measuring passage opening 36 is also provided in association with the second bus bar 18 in the printed circuit board 12. A second passage/contact area 38 provided at the second bus bar 18 meshes with the printed circuit board 12 at this second measuring passage opening 36 and is held therein by, for example, press fit. A second shunt contact surface 42, which ends essentially flush with the surface on the first side 32 of the printed circuit board 12, is provided again at the second passage/contact area 38, for example, as a cup-shaped bulge 40. The bar-like (bar-shaped) section of the bus bar 18 carrying the passage/contact area 38 extends on the second side of the printed circuit board 12 at a spaced location from this printed circuit board 12 in the case of the second bus bar 18 as well. In order to guarantee or maintain this state, the bus bars 16, 18 are configured as components that can be considered to be essentially rigid or stiff under the forces occurring during the use of the current-measuring unit 10.

It should be noted that the passage/contact areas 26, 38 may also be provided in an alternative embodiment by connecting, for example, essentially circular cylindrical passage/contact parts to bar parts of the bus bars 16, 18, which bar parts are to be arranged on the second side 34 of the printed circuit board 12. Since both the passage/contact parts and the bar parts are made of metallic material, for example, copper, connection by welding is possible in this case.

Extending at right angles, for example, to the drawing plane of FIG. 1, first and second measuring strip conductors 44, 46 are provided between the two measuring passage openings 24, 36 on the first side 32 of the printed circuit board 12. These measuring strip conductors 44, 46 lead from the area of the measuring passage openings 24, 36 into the area of the measuring electronic unit 14. The strip conductors 44, 46 may also be made, for example, with copper material.

A shunt resistor 48, preferably an SMD (Surface-Mounted Device) shunt resistor, is provided at the printed circuit board 12. The shunt resistor 48 is positioned such that a first contact area 50 thereof covers the first shunt contact surface 30 at the first passage/contact area 26 essentially nearly completely. A second contact area 52 of the shunt resistor 48 is likewise positioned such that it covers the second shunt contact surface 42 at the second passage/contact area 38 of the second bus bar 18 essentially completely. The two contact areas 50, 52 thus also cover the measuring strip conductors 44, 46 extending between the two measuring passage opening 24, 36.

The first contact area 50 of the shunt resistor 48 is connected electrically and mechanically to the printed circuit board 12 and to the first bus bar 16 and to the first measuring strip conductor 44 by soldering. A soldering area covering the first shunt contact surface 30 essentially completely is provided for this purpose. This soldering area 54 extends in the direction of the second measuring passage opening 36 to beyond the first shunt contact surface 30 such that the soldering area 54 also establishes a soldered connection between the first measuring strip conductor 44 and the first contact area 50. An area of the electrical and mechanical connection of the shunt resistor 48, which connection extends without interruption over the first shunt contact surface 30 and over the first measuring strip conductor 44, is thus provided in association with the first contact area 50 of the shunt resistor 48.

An alternative embodiment of the soldering of the shunt resistor 48 to the printed circuit board 12 and to the second bus bar 18 provided thereat and to the second measuring strip conductor 46 is provided in association with the second contact area 52. An electrical and mechanical connection of the second contact area 52 is carried out by a first soldering area 56 covering the second shunt contact surface 42 essentially completely. The electrical and mechanical connection to the second measuring strip conductor 46 is carried out by a second soldering area 58 formed separately from the first soldering area 56. It should be noted that the same type of soldering, i.e., either with a single soldering area 54 or with two separate soldering areas 56, 58 may preferably be provided in association with both bus bars 16, 18 and with the respective measuring strip conductors 44, 46 also associated with these in order to obtain a symmetrical and equally load-bearing connection. It would, however, also be possible, in principle, to carry out different types of soldering in the two contact areas 50, 52.

It becomes possible due to the above-described configuration of a current-measuring unit 10 to carry out a four-conductor measurement, in which the measuring electronic unit 14 is coupled to the shunt resistor 48 via the two measuring strip conductors 44, 46, to detect the electrical current sent over the two bus bars 16, 18. The large-surface electrical contacting of the contact areas 50, 52 of the shunt resistor 48 with the passage/contact areas of the bus bars 16, 18 ensures not only a very good electrical and mechanical connection of the shunt resistor 48, but it primarily also ensures an efficient thermal coupling of the contact areas 50, 52 with the two bus bars 16, 18. Thus, not only have the bus bars 16, 18 the function of carrying the current, i.e., for example, the battery current, but they are also used at the same time to dissipate heat generated in the area of the shunt resistor from the area of the shunt resistor 48 and hence from the area of the printed circuit board 12. The fact that also contributes to this is that the two bus bars 16, 18 extend at spaced locations from the printed circuit board 12 on the second side 34, i.e., generally on the rear side of the printed circuit board 12, so that a thermal contact, via which heat could again be transferred from the bus bars 16, 18 to the printed circuit boards 12, is avoided. The current-measuring unit 10 can be manufactured in a simple manner, especially also due to the fact that the bus bars 16, 18 are connected to the printed circuit board 12 in a simple yet stable manner. Since the heat generated in the area of the shunt resistor 48 can be dissipated efficiently based on the power loss generated, an excessive thermal load of this shunt resistor is ruled out, so that it is possible to do away with the use of power shunt resistors and a cost-effective SMD shunt resistor, which can be connected by soldering in a cost-effective and simple manner, can be used.

It should finally be pointed out that additional electronic units may, of course, also be provided on the printed circuit board. A plurality of such shunt resistors 48, connecting the two bus bars 16, 18 to one another, for example, in parallel, may be provided as well.

While specific embodiments of the invention have been shown and described in detail to illustrate the application of the principles of the invention, it will be understood that the invention may be embodied otherwise without departing from such principles.

What is claimed is:
1. A current-measuring unit comprising:
   a printed circuit board;
   a first bus bar leading to the printed circuit board and fixed at the printed circuit board, wherein the first bus bar comprises a first shunt contact surface;
   a second bus bar leading to the printed circuit board and fixed at the printed circuit board, wherein the second bus bar comprises a second shunt contact surface;
   a first measuring strip conductor at the printed circuit board and associated with the first bus bar;
   a second measuring strip conductor at the printed circuit board and associated with the second bus bar; and
   a shunt resistor comprising a first contact area connected to the first bus bar and connected to the first measuring strip conductor by soldering and comprising a second contact area connected to the second bus bar and connected to the second measuring strip conductor by soldering, wherein:
   the printed circuit board comprises a first measuring passage opening in association with the first bus bar;
   the first bus bar has a passage/contact area inserted into the first measuring passage opening;
   the first passage/contact area of the first bus bar provides the first shunt contact surface, positioned in an area of a first side of the printed circuit board, and the first bus bar extends on a second side of the printed circuit board, which second side faces away from the first side;
   the printed circuit board comprises a second measuring passage opening in association with the second bus bar;
   the second bus bar has a second passage/contact area inserted into the second measuring passage opening; and
   the second passage/contact area of the second bus bar provides the second shunt contact surface positioned in an area of the first side of the printed circuit board, and the second bus bar extends on the second side of the printed circuit board, which second side faces away from the first side.

2. A current-measuring unit in accordance with claim 1, wherein the first shunt contact surface or/and the second shunt contact surface is located essentially flush with a surface of the printed circuit board on the first side.

3. A current-measuring unit in accordance with claim 1, wherein:
   the first passage/contact area comprises a cup-shaped bulge at the first bus bar; or
   the second passage/contact area comprises a cup-shaped bulge at the second bus bar; or
   the first passage/contact area comprises a cup-shaped bulge at the first bus bar and the second passage/contact area comprises a cup-shaped bulge at the second bus bar.

4. A current-measuring unit in accordance with claim 1, wherein:
   the first bus bar is arranged on the second side of the printed circuit board at a spaced location from the printed circuit board; or
   the second bus bar is arranged on the second side of the printed circuit board at a spaced location from the printed circuit board; or
   the first bus bar is arranged on the second side of the printed circuit board at a spaced location from the printed circuit board and the second bus bar is arranged on the second side of the printed circuit board at a spaced location from the printed circuit board.

5. A current-measuring unit in accordance with claim 1, wherein:
   the first passage/contact area is accommodated in the first measuring passage opening with a press fit; or
   the second passage/contact area is accommodated in the second measuring passage opening with a press fit; or
   the first passage/contact area is accommodated in the first measuring passage opening with a press fit and the second passage/contact area is accommodated in the second measuring passage opening with a press fit.

6. A current-measuring unit in accordance with claim 1, wherein in at least one contact area of the first contact area and of the second contact area, the soldering comprises a first soldering area covering the associated shunt contact surface essentially completely and establishing a connection to the associated measuring strip conductor.

7. A current-measuring unit in accordance with claim 1, wherein in at least one contact area of the first contact area and of the second contact area the soldering comprises:
   a soldering area covering the associated shunt contact surface essentially completely; and a soldering area establishing a connection to the associated measuring strip conductor.

8. A current-measuring unit in accordance with claim 1, further comprising a measuring electronic unit provided at the printed circuit board and in contact with the first measuring strip conductor and in contact with the second measuring strip conductor.

9. A current-measuring unit comprising:
a printed circuit board;
a first bus bar comprising a first shunt contact surface, the first bus bar being engaged with and fixed to the printed circuit board so as to position the first shunt contact surface relative to the printed circuit board;
a second bus bar comprising a second shunt contact surface, the second bus bar being engaged with and fixed to the printed circuit board so as to position the second shunt contact surface relative to the printed circuit board;
a first measuring strip conductor at the printed circuit board and associated with the first bus bar;
a second measuring strip conductor at the printed circuit board and associated with the second bus bar;
a shunt resistor comprising a first contact area and a second contact area;
solder connecting the first contact area with the first shunt contact surface and the first measuring strip conductor; and
solder connecting the second contact area with the second first shunt contact surface and the second measuring strip conductor, wherein:
the printed circuit board comprises a first measuring passage opening in association with the first bus bar;
the first bus bar has a passage/contact area inserted into the first measuring passage opening to position the first shunt contact surface in an area of a first side of the printed circuit board with the first bus bar extending on a second side of the printed circuit board, which second side faces away from the first side;
the printed circuit board comprises a second measuring passage opening in association with the second bus bar; and
the second bus bar has a second passage/contact area inserted into the second measuring passage opening to position the second shunt contact surface in an area of the first side of the printed circuit board with the second bus bar extending on the second side of the printed circuit board.

10. A current-measuring unit in accordance with claim 9, wherein:
the first passage/contact area comprises a cup-shaped bulge at the first bus bar; and
the second passage/contact area comprises a cup-shaped bulge at the second bus bar.

11. A current-measuring unit in accordance with claim 9, wherein:

the first bus bar is arranged on the second side of the printed circuit board with a portion of the first bus bar at a spaced location from the printed circuit board; and
the second bus bar is arranged on the second side of the printed circuit board with a portion of the second bus bar at a spaced location from the printed circuit board.

12. A current-measuring unit in accordance with claim 9, wherein:
the first passage/contact area is accommodated in the first measuring passage opening with a press fit; and
the second passage/contact area is accommodated in the second measuring passage opening with a press fit.

13. A current-measuring unit in accordance with claim 9, wherein:
the solder connecting the first contact area with the first shunt contact surface and the first measuring strip conductor comprises a first solder area providing an electrical and mechanical connection of the first contact area with the first shunt contact surface; and a second solder area providing an electrical and mechanical connection of the first contact area with the first measuring strip conductor; and
the first solder area is physically separate from the second solder area.

14. A current-measuring unit in accordance with claim 9, wherein the solder connecting the first contact area with the first shunt contact surface and the first measuring strip conductor comprises a solder area providing an electrical and mechanical connection of the first contact area with the first shunt contact surface and the first measuring strip conductor.

15. A current-measuring unit in accordance with claim 9, wherein:
the solder connecting the second contact area with the second shunt contact surface and the second measuring strip conductor comprises a first solder area providing an electrical and mechanical connection of the second contact area with the second shunt contact surface; and a second solder area providing an electrical and mechanical connection of the second contact area with the second measuring strip conductor; and
the first solder area is physically separate from the second solder area.

16. A current-measuring unit in accordance with claim 9, wherein the solder connecting the second contact area with the second shunt contact surface and the second measuring strip conductor comprises a solder area providing an electrical and mechanical connection of the first contact area with the first shunt contact surface and the first measuring strip conductor.

17. A current-measuring unit in accordance with claim 9, further comprising a measuring electronic unit provided at the printed circuit board and in contact with the first measuring strip conductor and in contact with the second measuring strip conductor.

* * * * *